United States Patent
Chen et al.

(10) Patent No.: US 11,476,128 B2
(45) Date of Patent: Oct. 18, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Jenchun Chen, Kaohsiung (TW); An-Ping Chien, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 105 days.

(21) Appl. No.: 17/002,433

(22) Filed: Aug. 25, 2020

(65) Prior Publication Data
US 2022/0068665 A1  Mar. 3, 2022

(51) Int. Cl.
*B23K 1/00* (2006.01)
*H01L 21/50* (2006.01)
*H01L 21/60* (2006.01)

(52) U.S. Cl.
CPC .......... *H01L 21/50* (2013.01); *B23K 1/0008* (2013.01); *B23K 1/0016* (2013.01); *H01L 2021/60097* (2013.01)

(58) Field of Classification Search
CPC .......... H01L 21/50; H01L 2021/60097; B23K 1/0008; B23K 1/0016; B23K 2101/36–42
USPC .......... 228/179.1–180.22, 245–255, 215–216
See application file for complete search history.

(56) References Cited

U.S. PATENT DOCUMENTS

| | | | | |
|---|---|---|---|---|
| 3,739,463 | A * | 6/1973 | Aird | H01L 21/00 438/464 |
| 4,917,752 | A * | 4/1990 | Jensen | H01L 31/035281 228/180.1 |
| 5,178,318 | A * | 1/1993 | Edwin | H05K 3/3452 228/222 |
| 5,762,259 | A * | 6/1998 | Hubacher | H05K 3/3485 228/248.1 |
| 5,837,562 | A * | 11/1998 | Cho | G01P 1/023 438/125 |
| 6,199,259 | B1 * | 3/2001 | Demaray | C23C 14/3407 228/221 |
| 6,284,072 | B1 * | 9/2001 | Ryan | B82Y 40/00 204/192.1 |
| 6,292,369 | B1 * | 9/2001 | Daves | H01L 21/50 165/185 |
| 10,049,893 | B2 | 8/2018 | Chen et al. | |
| 10,276,521 | B2 | 4/2019 | Babcock et al. | |
| 2001/0020545 | A1 * | 9/2001 | Eldridge | H01L 25/0652 257/E21.507 |

(Continued)

FOREIGN PATENT DOCUMENTS

| | | | |
|---|---|---|---|
| DE | 4133183 A1 * | 4/1992 | |
| DE | 102016122486 A1 * | 5/2018 | |
| EP | 532297 A1 * | 3/1993 | .......... H01L 24/81 |

*Primary Examiner* — Kiley S Stoner
(74) *Attorney, Agent, or Firm* — Foley & Lardner LLP

(57) ABSTRACT

The present disclosure relates to a method of manufacturing a semiconductor device package. The method includes: (a) disposing a support structure on a first substrate; (b) electrically connecting a first electronic component on the first substrate, wherein a portion of the first electronic component is separated from the first substrate by the support structure; (c) heating the semiconductor device package; and (d) removing the support structure.

18 Claims, 9 Drawing Sheets

(56) References Cited

U.S. PATENT DOCUMENTS

| | | | | |
|---|---|---|---|---|
| 2006/0216857 A1* | 9/2006 | Zhao | ................ | H01L 24/94 |
| | | | | 438/109 |
| 2007/0228110 A1* | 10/2007 | Eldridge | ............ | H01L 21/4889 |
| | | | | 228/180.5 |
| 2008/0164606 A1* | 7/2008 | Greisen | ................ | H01L 23/10 |
| | | | | 438/455 |
| 2009/0166397 A1* | 7/2009 | Meng | ................ | B23K 1/018 |
| | | | | 228/191 |
| 2010/0065963 A1* | 3/2010 | Eldridge | ............ | H01L 24/78 |
| | | | | 257/734 |
| 2011/0074009 A1* | 3/2011 | Hughes | ............ | H01L 23/49811 |
| | | | | 257/E23.024 |
| 2012/0080784 A1* | 4/2012 | Kadakia | ............ | H01L 23/4338 |
| | | | | 257/E23.181 |
| 2012/0326294 A1* | 12/2012 | Sikka | ................ | H01L 23/04 |
| | | | | 438/107 |
| 2018/0019235 A1* | 1/2018 | Fan | ................ | H01L 21/50 |
| 2020/0279732 A1* | 9/2020 | Kawamoto | ............ | C23C 14/0005 |

* cited by examiner

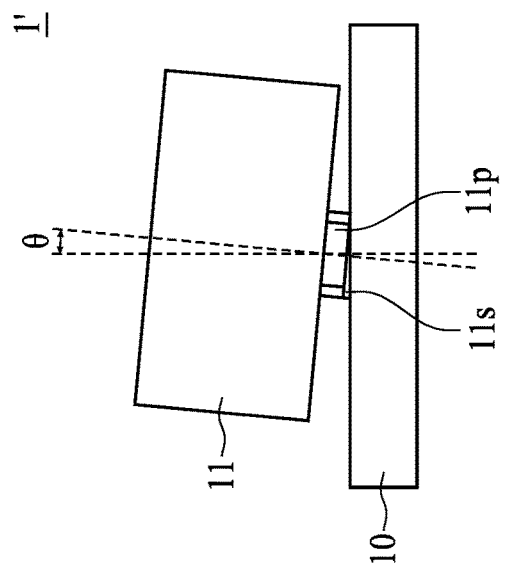
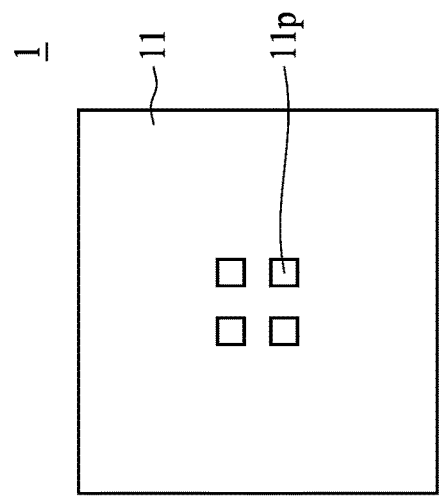
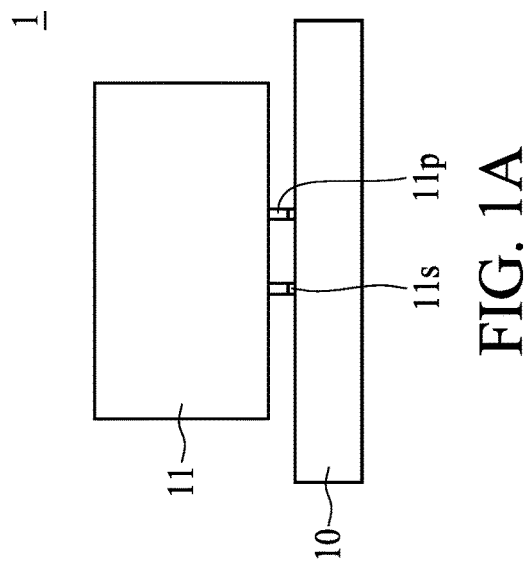
FIG. 1C
FIG. 1B
FIG. 1A

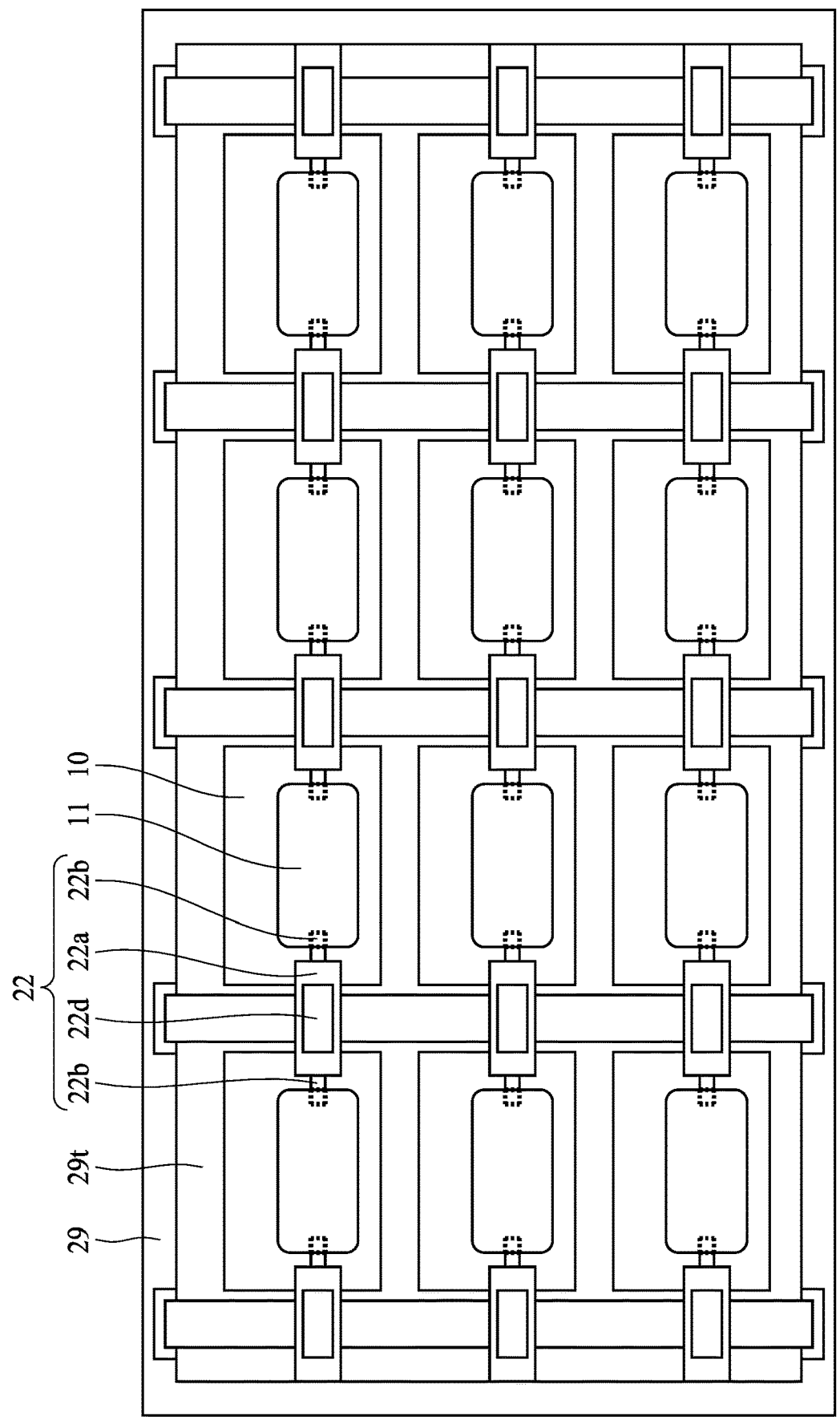
FIG. 2D"

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an anti-tilt mechanism and a method of manufacturing the same.

2. Description of the Related Art

In semiconductor device packages, one or more electronic components may be disposed on a substrate and electrically connected to the substrate through solders. However, the solders might be melted during high-temperature processes (e.g., the reflow process), and thus the electronic component may tilt relative to the substrate, which would adversely affect the electrical performance of the electronic component.

SUMMARY

In accordance with some embodiments of the present disclosure, a method of manufacturing a semiconductor device package includes (a) disposing a support structure on a first substrate; (b) electrically connecting a first electronic component on the first substrate, wherein a portion of the first electronic component is separated from the first substrate by the support structure; (c) heating the semiconductor device package; and (d) removing the support structure.

In accordance with some embodiments of the present disclosure, a method of manufacturing a semiconductor device package includes (a) disposing a plurality of substrates on a carrier, the substrates spaced apart from each other; (b) disposing a plurality of support structures on the substrates, each of the support structures disposed on two adjacent substrates and partially extending within a gap defined by two adjacent substrates; and (c) electrically connecting a plurality of electronic components on the substrates respectively, wherein each of the electronic components covers a portion of the support structure.

BRIEF DESCRIPTION OF THE DRAWINGS

FIG. 1A illustrates a cross-sectional view of a semiconductor device package, in accordance with some embodiments of the present disclosure.

FIG. 1B illustrates a bottom view of an electronic component, in accordance with some embodiments of the present disclosure.

FIG. 1C illustrates a cross-sectional view of a semiconductor device package, in accordance with some embodiments of the present disclosure.

Figure 2A:
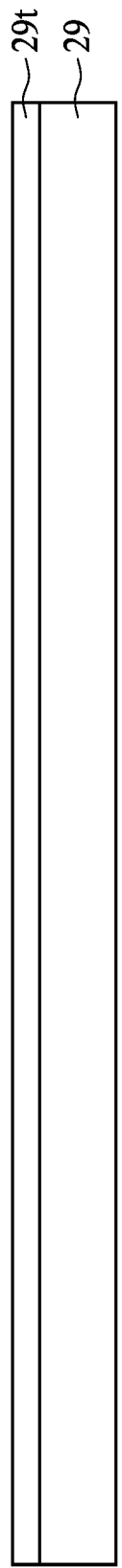
FIG. 2A, FIG. 2B, FIG. 2C, FIG. 2D, FIG. 2D', FIG. 2D"

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1, in accordance with some embodiments of the present disclosure. The semiconductor device package 1 includes a substrate 10 and an electronic component 11.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate.

The electronic component 11 is disposed on the substrate 10. The electronic component 11 is electrically connected to the substrate 10. For example, the electronic component 11 may include one or more electrical contacts 11p (e.g., conductive pillars) on its active surface, and the electrical contacts 11p are electrically connected to the substrate 10 via solders 10s (e.g., soldering material such as solder pastes or solder balls). In some embodiments, the electronic component 11 may include an active device (e.g., a die or a chip), a passive device (e.g., a capacitor, a resistor or an inductor) or the like.

In some embodiments, as shown in FIG. 1B, which illustrates a bottom view of the electronic component 11, the electrical contacts 11p are disposed adjacent to the center of the bottom surface (e.g., active surface) of the electronic component 11. For example, the electrical contacts 11p are disposed far away from edges of the bottom surface of the electronic component 11. In some embodiments, the distance between the electrical contacts 11p and the edge of the bottom surface of the electronic component 11 is in a range from about 0.15 millimeters (mm) to about 2 mm.

In some embodiments, the solders 10s might be melted during high-temperature processes (e.g., the reflow process), and thus the electronic component 11 may tilt relative to the substrate due to the force applied by the melted solders 10s. This would adversely affect the electrical performance of the electronic component 11 due to incomplete connection between the electrical component 11 and the substrate 10. The tilt issue of the electronic component 11 would become severer in the case that the electronic component 11 has a relative tall and thin structure and/or the electrical contacts 11p are mainly located at or adjacent to the center of the active surface of the electronic component 11 as shown in FIG. 1B. For example, as shown in FIG. 1B, if the distance between the electrical contacts 11p and the edge of the bottom surface of the electronic component 11 is greater than 0.15 mm, an tilt angle θ (which can be defined by a central line of the electronic component 11 and a line perpendicular to the substrate 10) would be greater than 5 degrees.

Figure 2B:
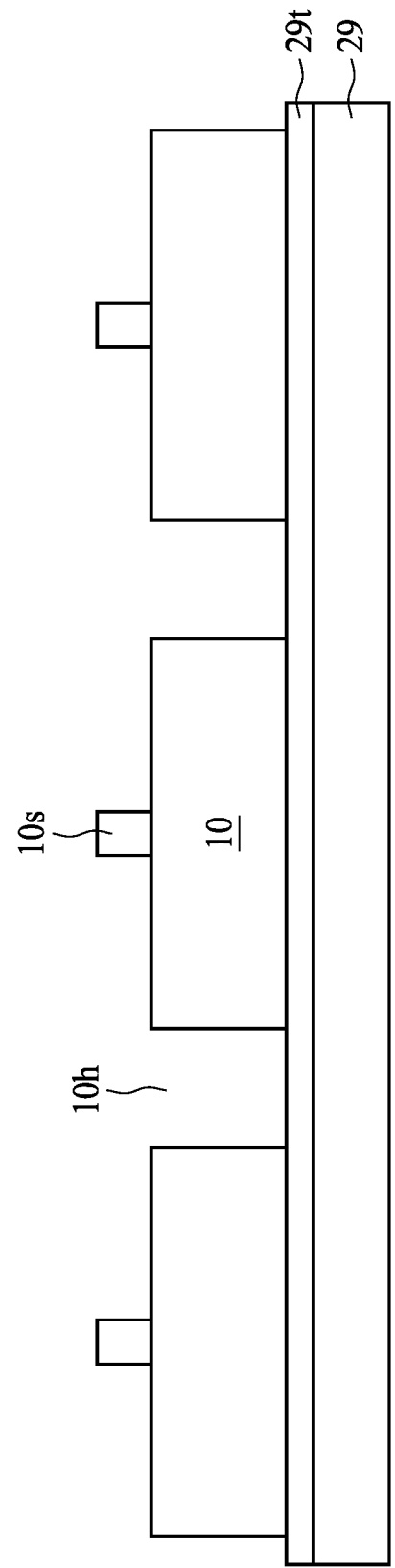
Figure 2C:
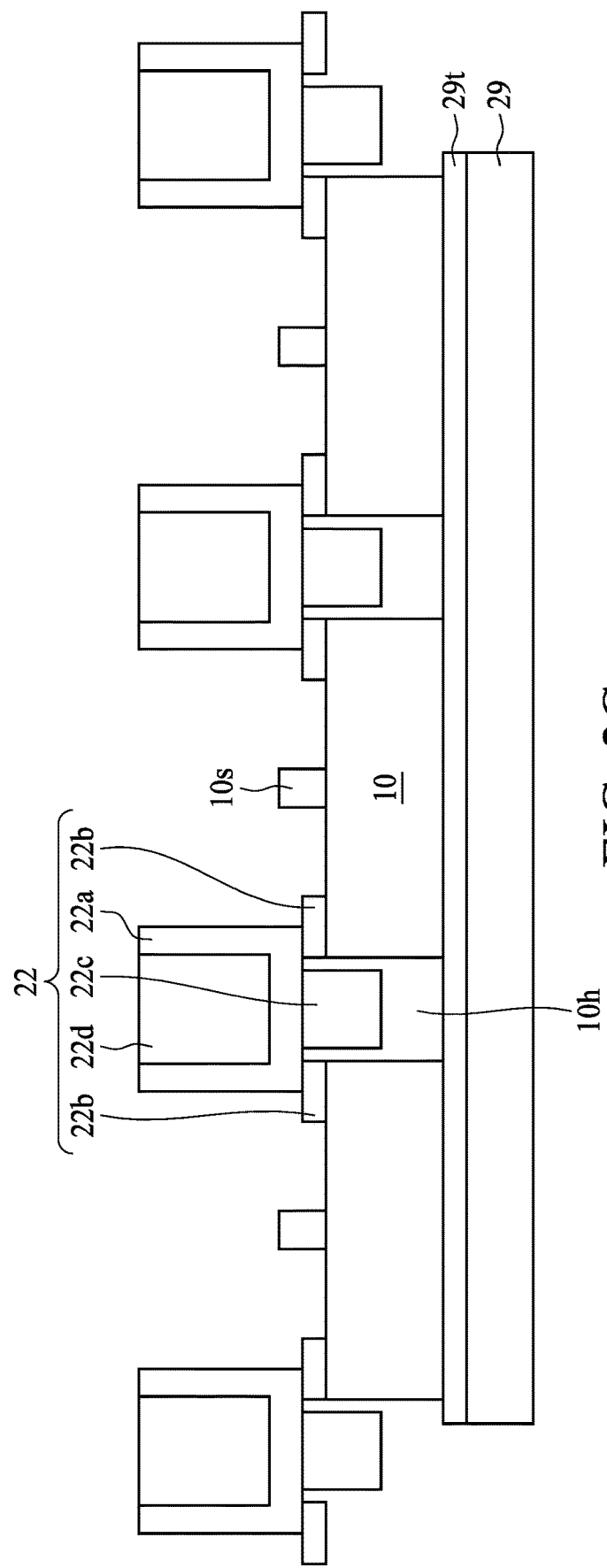
Figure 2D:
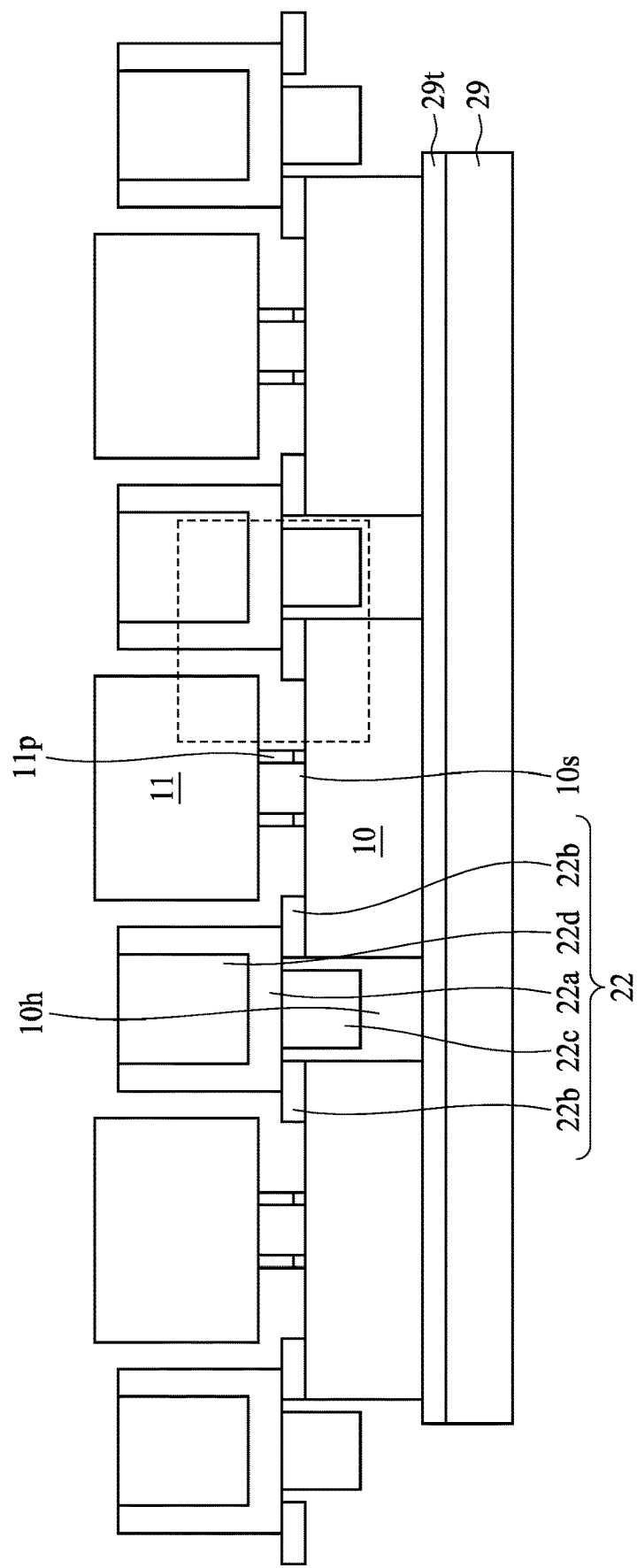
Figure 2D:
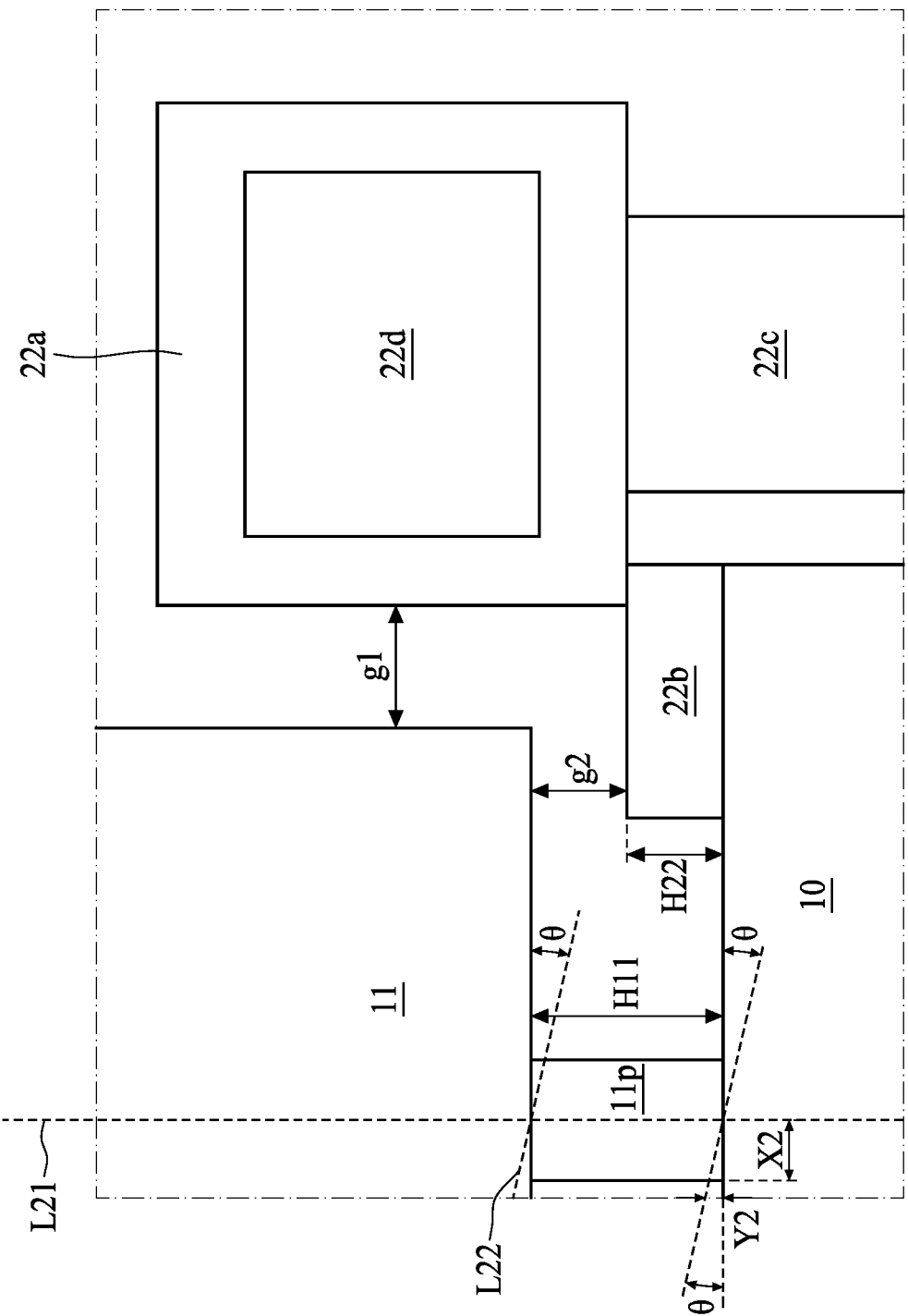
Figure 2E:
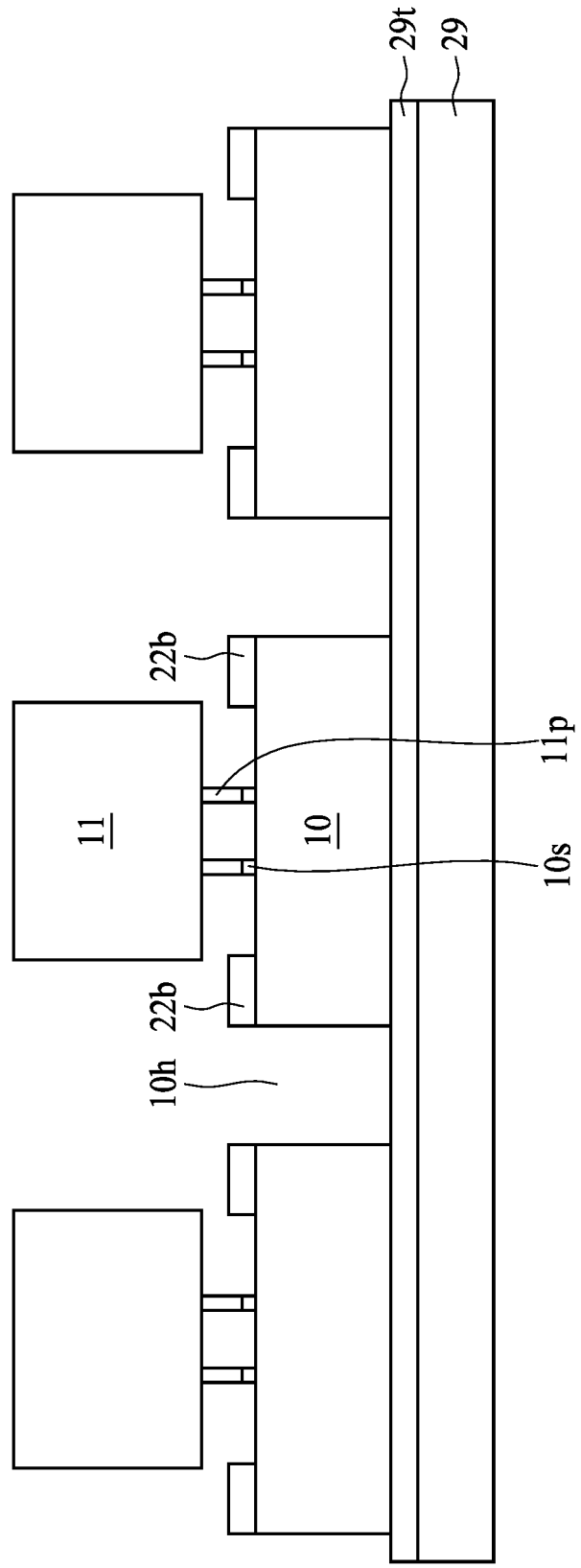
FIG. 2E, FIG. 2F and FIG. 2G illustrate a semiconductor manufacturing method in accordance with some embodiments of the present disclosure.
Figure 2F:
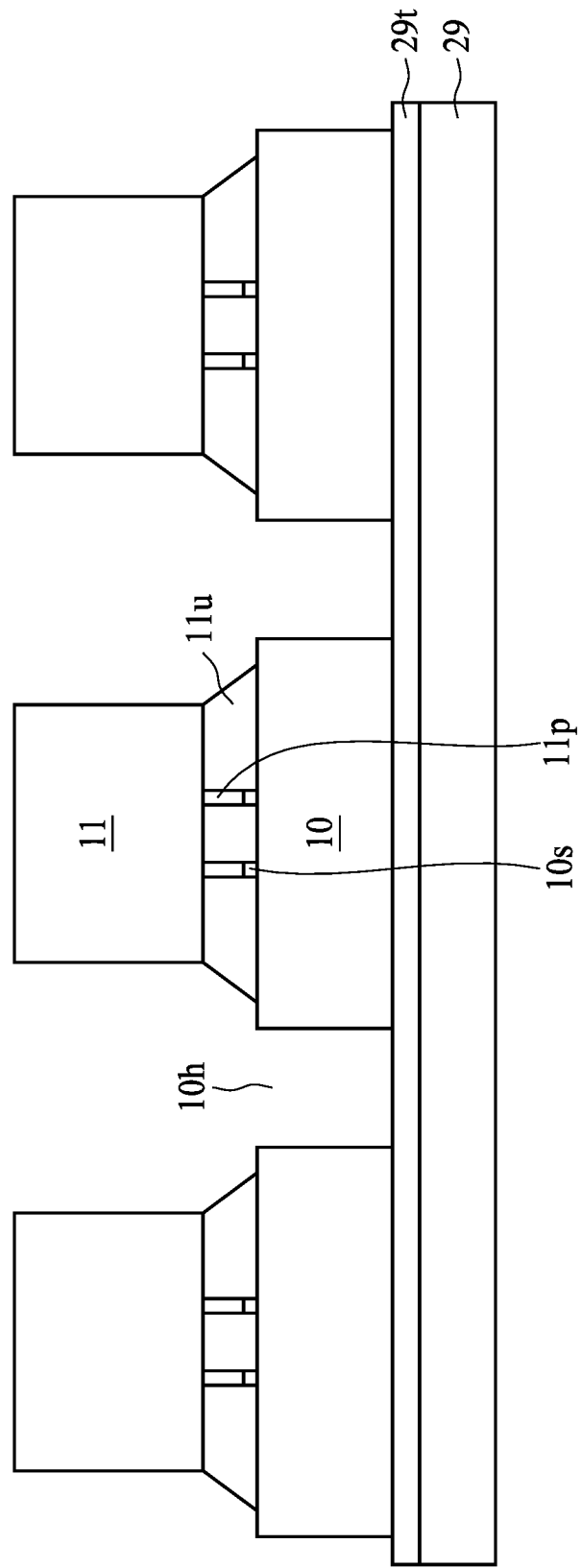
Figure 2G:
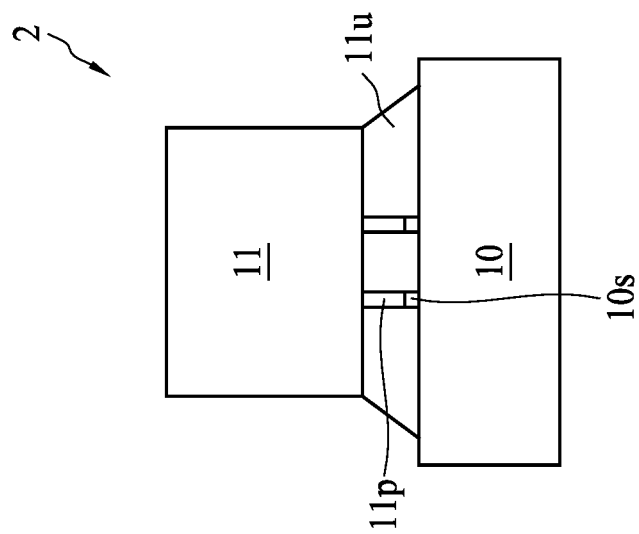

FIG. 2A, FIG. 2B, FIG. 2C, FIG. 2D, FIG. 2D', FIG. 2D", FIG. 2E, FIG. 2F and FIG. 2G illustrate a semiconductor manufacturing method, in accordance with some embodiments of the present disclosure.

Referring to FIG. 2A, a carrier 29 is provided. In some embodiments, the carrier 29 has an adhesive layer 29t (e.g., a tape, a glue, an adhesive film or the like) disposed thereon. In some embodiments, a baking operation may be carried out to the substrate 10.

Referring to FIG. 2B, a plurality of substrates including the substrate 10 is disposed on the carrier 29. The substrates are connected to the carrier 29 through the adhesive layer 29t. In some embodiments, the substrates are disposed on the carrier 29 by, for example, pick-and-place or any other suitable techniques. The substrates are separated from each other. For example, there is a gap 10h (or a distance) between two adjacent substrates 10. One or more solders 10s (or solder paste) are formed on each of the substrates. In some embodiments, the solders 10s may be formed by, for example, printing or any other suitable operations.

Referring to FIG. 2C, a support structure 22 is disposed on the substrates. In some embodiments, the support structure 22 may extend within the gap 10h between two adjacent substrates. In some embodiments, the support structure 22 may include a metal or an alloy. In some embodiments, the support structure 22 includes parts 22a, 22b, 22c and a magnetic element 22d (e.g., a magnet).

The magnetic element 22d is disposed within the part 22a of the support structure 22. For example, the magnetic element 22 is at least partially covered or encapsulated by the part 22a of the support structure 22. For example, at least a bottom surface and lateral surfaces of the magnetic element 22 are in contact with the part 22a of the support structure 22. In other embodiments, a top surface of the magnetic element 22 may be covered by and in contact with the part 22a of the support structure 22.

The part 22b is connected to the part 22a. The part 22b is disposed on a bottom surface of the part 22a. In some embodiments, the part 22b and the part 22a are separately formed. For example, the part 22b and the part 22a are separate pieces. The part 22b may be connected to the part 22a by a magnetic force of the magnetic element 22d. The part 22b is disposed on two adjacent substrates. The part 22b is disposed adjacent to the edges of the substrates.

The part 22c is disposed on the bottom surface of the part 22a. The part 22c may be spaced apart from the part 22b. The part 22c extends within the gap 10h between two adjacent substrates to prevent the movement of the support structure 22. In some embodiments, the part 22c and the part 22a are integratedly-formed in one piece. Alternatively, the part 22c and the part 22a are separate pieces and connected to each other through an adhesive.

Referring to FIG. 2D, electronic components 11 are disposed on each of the substrates including the substrate 10. Each electronic component 11 may be at least partially disposed within a space defined by two adjacent support elements 22. In some embodiments, the electronic components 11 are disposed on the substrates by, for example, pick-and-place or any other suitable techniques.

FIG. 2D' illustrates an enlarged view of a portion of the structure encircled by a dotted-line square as shown in FIG. 2D, in accordance with some embodiments of the present disclosure. As shown in FIG. 2D', the part 22a of the support structure 22 is spaced apart from the electronic component 11 (e.g., a lateral surface of the electronic component 11). For example, there is a gap (or a distance) g1 between the part 22a of the support structure 22 and the electronic component 11. In some embodiments, the distance g1 is equal to or greater than 1 mm, which can prevent the collision between the electronic component 11 and the part 22a of the support structure 22.

In some embodiments, a portion of the part 22b of the support structure 22 extends under the electronic component 11. For example, as shown in FIG. 2D", which illustrates a top view of the structure as shown in FIG. 2D in accordance with some embodiments of the present disclosure, a portion of the part 22b of the support structure 22 is covered by the electronic component 11 while another portion of the part 22b of the support structure 22 is exposed from the electronic component 11. In some embodiments, the support structure 22 may be disposed by the following operations: (i) disposing the part 22b of each of the support structures on edges of two adjacent substrates; (ii) disposing the part 22a (along with the part 22c) of each of the support structures within the gap between two adjacent substrates and along a short-side direction of the carrier 29; and (iii) disposing the part 22a (along with the part 22c) of each of the support structures from a first long side to a second long side opposite to the first long side of the carrier 29.

In some embodiments, as shown in FIG. 2D', the portion of the part 22b of the support structure 22 extending under the support structure 22 does not contact the electrical contact 11p. For example, the part 22b of the support structure 22 is spaced apart from the electrical contact 11p of the electronic component 11. In some embodiments, a top surface of the part 22b of the support structure 22 is spaced apart from a bottom surface (e.g., an active surface) of the electronic component 11. For example, there is a gap (or a distance) g2 between the top surface of the part 22b of the support structure 22 and the bottom surface of the electronic component 11.

Still referring to FIG. 2D, the electrical contacts 11p of the electronic component 11 are substantially aligned with the corresponding solders 10s on each substrate. Then, a reflow operation can be carried out to melt the solders 10s, so that the electronic component 11 can be electrically connected to the substrate.

As shown in FIGS. 2D and 2D', if the electronic component 11 tilts during the pick-and-place operation and/or the reflow operation, the electronic component 11 would be supported or held by the support element 22. For example, the bottom surface of the electronic component 11 may be in contact with and held by the part 22b of the support element 22, which can mitigate the tilt issue of the electronic component 11 during the manufacturing process. Hence, in the case that a tilt of the electronic component 11 occurs, an angle defined by a central line of the electronic component 11 and a line perpendicular to the substrate 10 is equal to or less than 5 degrees. This would significantly increase the yield rate of the semiconductor device package.

In some embodiments, by increasing the thickness of the part 22b of the support structure 22, the tilt issue can be further reduced. For example, the angle defined by the central line of the electronic component 11 and the line perpendicular to the substrate 10 can be less than 1 degree. However, a clearance between the part 22b of the support structure 22 and the bottom surface of the electronic component 11 may be kept to avoid the part 22b of the support structure 22 from contacting the bottom surface of the electronic component 11 to damage the electronic component 11. In some embodiments, as shown in FIG. 2D', the distance g2 is about 20% to about 30% of a height H11 of the electrical contact 11p of the electronic component 11. For example, the distance g2 is about 25% of the height H11 of the electrical contact 11p of the electronic component 11. In some embodiments, the thickness H22 of the part 22b of the support structure 22 is about 70% to about 80% of the height H11 of the electrical contact 11p of the electronic component 11. For example, the thickness H22 of the part 22b of the support structure 22 is about 75% of the height H11 of the electrical contact 11p of the electronic component 11.

For example, as shown in FIG. 2D', the maximum tilt angle θ of the electronic component 11 can be expressed by $\theta = \tan^{-1} Y2/X2$, where X2 is the radius of the electrical contact 11p and Y2 is a liftoff distance of the electrical contact 11p. In some embodiments, the liftoff distance of the electrical contact 11p may be determined based on the distance g2 or the thickness H22 of the part 22b of the support structure 22. Hence, the radius of the electrical contact 11p and the thickness H22 of the part 22b of the support structure 22 can be determined to ensure that the maximum tilt angle θ is less than 5 degrees.

Referring to FIG. 2E, the magnetic element 22d is removed from the support structure 22, and then the parts 22a and 22c are removed. Without the magnetic element 22d, the part 22b would not be connected to the part 22a by the magnetic force, and thus the part 22b may be left on the substrates.

Referring to FIG. 2F, the part 22b of the support structure 22 is removed. For example, a liquid or a gas is applied (or injected) toward the part 22b of the support structure 22 to remove the part 22b. In some embodiments, a de-flux operation and a plasma clean operation may be then carried out to clean the structure as shown in FIG. 2F.

Then, an underfill 11u may be formed between the electronic component 11 and the substrate 10 to cover or encapsulate the electrical contacts 11p and the solders 10s. In some embodiments, the underfill 11u includes an epoxy resin, a molding compound (e.g., an epoxy molding compound or other molding compound), a polyimide, a phenolic compound or material, a material including a silicone dispersed therein, or a combination thereof.

Referring to FIG. 2G, the semiconductor device packages are detached from the carrier 29 and the adhesive layer 29t to form individual semiconductor device packages including the semiconductor device package 2. In other embodiments, each of the semiconductor device packages including the semiconductor device package 2 is picked up from the adhesive layer 29t.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A method of manufacturing a semiconductor device package comprising:
   (a) disposing a support structure on a first substrate, wherein the support structure has a first part and the second part;
   (b) electrically connecting a first electronic component on the first substrate, wherein a portion of the first electronic component is separated from the first substrate by the support structure, the first part of the support structure and the first electronic component are disposed side by side, and the second part of the support structure at least partially separates the first electronic component from the first substrate;
   (c) heating the semiconductor device package; and (d) removing the support structure, and in operation (d) further comprising:
  (d1) removing the first part of the support structure to leave the second part on the first substrate; and
  (d2) removing the second part of the support structure.

2. The method of claim 1, in operation (c), further comprising melting a soldering material electrically connecting the first electronic component with the first substrate.

3. The method of claim 2, further comprising:
  moving a first portion of a bottom surface of the first electronic component toward the first substrate; and
  moving a second portion of the bottom surface of the electronic component away from first substrate.

4. The method of claim 3, wherein the bottom surface of the first electronic component is in contact with a top surface of the portion of the support structure.

5. The method of claim 3, wherein a central line of the first electronic component and a line perpendicular to the first substrate define an angle less than 5 degrees.

6. The method of claim 1, wherein the second part of the support structure is removed by applying a liquid or a gas toward the second part of the support structure.

7. The method of claim 1, after operation (d2), further comprising forming an underfill between the first electronic component and the first substrate.

8. The method of claim 1, prior to operation (a), further comprising providing a second substrate adjacent to the first substrate and spaced apart from the first substrate to define a gap, wherein the support structure further comprises a third part extending within the gap.

9. The method of claim 1, wherein
  the first electronic component has an electrical contact on a bottom surface of the first electronic component facing the first substrate and connecting to the first substrate; and
  a thickness of the second part of the support structure is 70% to 80% of a height of the electrical contact.

10. The method of claim 9, wherein a distance between the second part of the support structure and the bottom surface of the first electronic component is 20% to 30% of the height of the electrical contact.

11. A method of manufacturing a semiconductor device package, comprising:
  (a) disposing a plurality of substrates on a carrier, the substrates spaced apart from each other;
  (b) disposing a plurality of support structures on the substrates, each of the support structures disposed on two adjacent substrates and partially extending within a gap defined by two adjacent substrates; and
  (c) electrically connecting a plurality of electronic components on the substrates respectively, wherein each of the electronic components covers a portion of at least one of the plurality of support structures.

12. The method of claim 11, operation (b) further comprising:
  disposing a first part of each of the support structures on an edge of each of the substrates; and
  disposing a second part of each of the support structures within the gap along a short-side direction of the carrier.

13. The method of claim 12, further comprising: disposing the second part of each of the support structures from a first long side to a second long side opposite to the first long side of the carrier.

14. The method of claim 12, further comprising connecting the first part with the second part of each of the support structures.

15. The method of claim 14, wherein the first part of each of the support structures is connected with the second part of each of the support structures by a magnetic force.

16. A method of manufacturing a semiconductor device package, comprising:
  (a) disposing a support structure on a first substrate, wherein the support structure has a first part and the second part, and the first part of the support structure and the second part of the support structure is connected by a magnetic force;
  (b) electrically connecting a first electronic component on the first substrate, wherein a portion of the first electronic component is separated from the first substrate by the support structure, the first part of the support structure and the first electronic component are disposed side by side, and the second part of the support structure at least partially separates the first electronic component from the first substrate;
  (c) heating the semiconductor device package; and
  (d) removing the support structure.

17. The method of claim 16, wherein the support structure further comprises a magnetic element disposed within the first part of the support structure to provide the magnetic force.

18. A method of manufacturing a semiconductor device package, comprising:
  (a) disposing a support structure on a first substrate, wherein the support structure has a first part and the second part;
  (b) electrically connecting a first electronic component on the first substrate, wherein a portion of the first electronic component is separated from the first substrate by the support structure, the first part of the support structure and the first electronic component are disposed side by side, and the second part of the support structure at least partially separates the first electronic component from the first substrate;
  (c) heating the semiconductor device package; and
  (d) removing the support structure,
  wherein prior to operation (a), the method further comprises providing a second substrate adjacent to the first substrate and spaced apart from the first substrate to define a gap, wherein the support structure further comprises a third part extending within the gap; and
  electrically connecting a second electronic component to the second substrate, wherein the support structure has a fourth part at least partially extending within a space defined by the second electronic component and the second substrate.

* * * * *